United States Patent [19]

Yanagi et al.

[11] Patent Number: 5,169,451

[45] Date of Patent: Dec. 8, 1992

[54] VACUUM VAPOR DEPOSITION APPARATUS

[75] Inventors: Kenichi Yanagi; Toshio Taguchi, both of Hiroshima; Yoshiteru Moriyama, Osaka; Mitsuhiko Sako, Osaka; Takuya Akio, Osaka; Shinji Kamura, Osaka; Heisaburo Furukawa, Hiroshima; Kenji Atarashiya, Hiroshima; Seiji Yokoro, Hiroshima, all of Japan

[73] Assignees: Mitsubishi Jukogyo Kabushiki Kaisha; Nisshin Steel Co., Ltd., both of Tokyo, Japan

[21] Appl. No.: 766,766

[22] Filed: Sep. 27, 1991

[30] Foreign Application Priority Data

Sep. 28, 1990 [JP] Japan .................. 2-257430

[51] Int. Cl.⁵ ........................... C23C 14/24
[52] U.S. Cl. .................... 118/718; 118/719; 118/726; 118/733
[58] Field of Search ............. 118/718, 719, 726, 733

[56] References Cited

U.S. PATENT DOCUMENTS 4,643,131  2/1987  Umeda ................. 118/718
4,655,168  4/1987  Shimozato ........... 118/718

FOREIGN PATENT DOCUMENTS 59-038382  6/1984  Japan .
1-184270  10/1989  Japan .
1-225768  12/1989  Japan .

OTHER PUBLICATIONS

"Patent Abstracts of Japan", vol. 13, No. 549 (C-662) (3897) Dec. 7, 1989.
"Patent Abstracts of Japan", vol. 13, No. 472 (C-647) (3820) Oct. 25, 1989.
"Patent Abstracts of Japan", vol. 8, No. 126 (C-228) (1563) Jun. 13, 1984.

Primary Examiner—Richard Bueker
Attorney, Agent, or Firm—Wenderoth, Lind & Ponack

[57] ABSTRACT

An improved vacuum vapor-deposition apparatus comprises an evaporation tank for holding and evaporating vapor deposition material, a hood covering the top of the evporation tank and extended up to its outside in the horizontal direction, inlet and outlet ports of a band to be vapor-deposited, which are opened in the hood so as to penetrate a central portion of the extension on the outside of the evaporation tank, and a vacuum tank covering the evaporation tank and the hood entirely and having sealing devices for carrying in and carrying out the band to be vapor-deposited at the positions corresponding to the inlet and outlet ports in the hood. Vapor deposition is effected within the hood simultaneously onto the both front and rear surfaces of the band to be vapor-deposited. Preferably, the vacuum vapor-deposition apparatus further comprises a vapor amount control device for controlling a vapor amount of the evaporated material led to the both front and rear sides of the band to be vapor-deposited within the hood, and a vapor-deposited surface area control device provided at least on one side of the front and rear sides of the band to be vapor-deposited within the hood for controlling a vapor-deposited surface area of the band to be vapor-deposited. Then, vapor-deposition of different thickness is effected within the hood onto the front and rear surfaces of the band to be vapor-deposited.

9 Claims, 6 Drawing Sheets

VACUUM VAPOR DEPOSITION APPARATUS

BACKGROUND OF THE INVENTION

1. Field of the Invention

The present invention relates to a vacuum vapor deposition apparatus for vacuum vapor-depositing metal such as zinc, ceramics and the like.

2. Description of the Prior Art

Heretofore, as an apparatus for carrying out vapor deposition onto both surfaces of a band to be vapor-deposited, the following vapor deposition apparatus were proposed.

A wrapping roll type vapor deposition apparatus proposed in Japanese Patent Publication No. 61-60912 (1986) is shown in FIG. 8. As shown in this figure, along a conveying route of a band 01 are provided vacuum tanks 02A and 02B for respectively effecting vapor-deposition on one surface. Within the respective vacuum tanks 02A and 02B are respectively provided evaporation tanks 04A and 04B wherein molten metals 03A and 03B are held, hoods 07A and 07B for leading metal vapors 05A and 05B evaporated in the evaporation tanks 04A and 04B to vapor-deposition ports 06A and 06B, and wrapping rolls 08A and 08B disposed in opposition to the vapor-deposition ports 06A and 06B, so that the band 01 is adapted to be opposed to the vapor-deposition ports 06A and 06B as wrapped around the wrapping rolls 08A and 08B, respectively. It is to be noted that in FIG. 8, reference numerals 09A and 09B designate shutters for controlling the amounts of the metal vapors 05A and 05B led to the vapor-deposition ports 06A and 06B, reference numerals 010A and 010B designate atmospheric melting tanks, numerals 011A and 011B designates snorkels for feeding the molten metals 03A and 03B from the atmospheric melting tanks 010A and 010B, respectively, to the evaporation tanks 04A and 04B, numerals 012A and 012B designate heaters for heating and evaporating the molten metals 03A and 03B within the evaporation tanks 04A and 04B, and numeral 013 designate seal devices of the vacuum tanks 02A and 02B provided at the inlet and outlet ports of the band 01.

In the above-described wrapping roll type vapor deposition apparatus, the band 01 is successively carried in as wrapped around the wrapping rolls 08A and 08B within the vacuum tanks 02A and 02B, respectively, and after vapor deposition has been effected to its surface on one side within the vacuum tank 02A and to its surface on the other side within the vacuum tank 02B, it is carried out as a vapor-deposited band 01a.

In addition, a plate type vapor deposition apparatus wherein heated flat plates are used in place of the wrapping rolls 08A and 08B was also proposed (Japanese Patent Application No. 63-7010 (1988)). This apparatus is shown in FIG. 9. In this figure, reference numerals 014A and 014B designate heated flat plates. It is to be noted that since the other construction is almost similar to that of the apparatus shown in FIG. 8, members performing the same functions are given like reference numerals, and further explanation thereof will be omitted.

In this apparatus also, the band 01 is sequentially carried into the two vacuum tanks 02A and 02B, and after vapor deposition has been effected to the surface on one side within the vacuum tank 02A and to its surface on the other side within the vacuum tank 02B, it is carried out as a vapor-deposited band 01a.

In the above-described vacuum vapor deposition apparatus in the prior art, in the case of vapor-depositing, for example, zinc to the front surface and the rear surface of the band, vacuum tanks and vapor-deposition apparatuses are respectively necessitated two, and also, since the atmospheric melting furnaces or the like are also respectively provided in the respective vapor deposition apparatuses as feeding devices of zinc, there was a problem that a number of equipments was large and the cost was also high.

In addition, in the above-described apparatus shown in FIG. 8 or 9, in the case of carrying out differential thickness plating in which an amount of vapor-deposition of zinc is made different between the front surface and the rear surface of the band 01, the amounts of deposition on the front and rear surfaces can be respectively controlled by means of the shutters 09A and 09B. However, in the case where vapor deposition ports are provided on the front surface side and on the rear surface side of the band, for instance, within a single vacuum tank for the purpose of reducing the number of equipments, there is a problem that upon carrying out differential thickness plating the vapors on the front surface side and on the rear surface side would interfere and would result in irregularity in the distribution of a deposited amount.

SUMMARY OF THE INVENTION

It is therefore one object of the present invention to provide a novel vacuum vapor deposition apparatus, wherein a number of equipments is reduced to achieve saving of space and reduction of cost, and also even differential thickness plating or one-side surface plating can be carried out at high quality.

According to one feature of the present invention, there is provided a vacuum vapor deposition apparatus comprising an evaporation tank for holding and evaporating vapor deposition material, a hood covering the top of the evaporation tank and extended up to its outside in the horizontal directions, inlet and outlet ports of a band to be vapor-deposited, which are opened in the hood so as to penetrate a central portion of the extension on the outside of the evaporation tank, and a vacuum tank covering the evaporation tank and the hood entirely and having sealing devices for carrying in and carrying out the band to be vapor-deposited at the positions corresponding to the inlet and outlet ports in the hood, whereby vapor deposition is effected within the hood simultaneously on the both front and rear surfaces of the band to be vapor-deposited.

According to another feature of the present invention, there is provided a vacuum vapor deposition apparatus comprising an evaporation tank for holding and evaporating vapor deposition material, a hood covering the top of the evaporation tank and extended up to its outside in the horizontal directions, inlet and outlet ports of a band to be vapor-deposited, which are opened in the hood so as to penetrate a central portion of the extension to the outside of the evaporation tank, a vacuum tank covering the evaporation tank and the hood entirely and having sealing devices for carrying in and carrying out the band to be vapor-deposited at the positions corresponding to the inlet and outlet ports in the hood, a vapor amount control device for controlling a vapor amount of the evaporated material led to the both front and rear sides of the band to be vapor-deposited within the hood, and a vapor-deposited surface area control device provided on at least one side of the front and rear sides of the band to be vapor-deposited within the hood for controlling a vapor-deposited surface area of the belt to be vapor-deposited, whereby vapor-deposition of different thickness is effected within the hood onto the front and rear surfaces of the band to be vapor-deposited.

According to other feature of the present invention, there is provided a vacuum vapor deposition apparatus comprising an evaporation tank for holding and evaporating vapor deposition material, a hood covering the top of the evaporation tank and extended up to its outside in the horizontal directions, inlet and outlet ports of a band to be vapor-deposited, which are opened in the hood so as to penetrate a central portion of the extension to the outside of the evaporation tank, a vacuum tank covering the evaporation tank and the hood entirely and having sealing devices for carrying in and carrying out the band to be vapor-deposited at the positions corresponding to the inlet and outlet ports in the hood, and a vapor amount control device for controlling a vapor amount of the evaporated material led to the both front and rear sides of the band to be vapor-deposited within the hood, whereby vapor-deposition of different thickness is effected within the hood onto the front and rear surfaces of the band to be vapor-deposited.

In the first-featured vacuum vapor deposition apparatus according to the present invention, channels for vapor-deposition are formed by the hood on the both sides of a band to be vapor-deposited, and vapor of vapor-deposition material evaporated in a single evaporation tank is led to these two channels by means of the hood. Accordingly, vapor-deposition is effected simultaneously onto the both front and rear surfaces of the band to be vapor-deposited which is led through the sealing devices for carrying in and carrying out of the vacuum tank and the inlet and outlet ports of the hood.

On the other hand, in the second-featured vacuum vapor deposition apparatus according to the present invention, the amounts of vapor led to the respective channels on the front and rear surface sides of the band to be vapor-deposited are controlled by the vapor amount control device, and at the same time, the areas of the vapor-deposition ports on the both front and rear sides are regulated according to the vapor amount by the vapor-deposited surface area control device. Thereby, the vapor pressures on the front and rear surface sides of the band to be vapor-deposited are equalized, and interference between vapors on the respective sides of the band is prevented to make uniform the distribution of deposited amounts in the widthwise direction on the front and rear surfaces of the band.

This operation will be described in detail in the following.

Originally, in the case of effecting different thickness plating by means of a vapor deposition apparatus in which channels are formed in an opposed relation with a band placed therebetween, for instance, surplus vapor of the vapor to be deposited to a front surface as bounded by the band would get over the band and would interfere with the vapor to be deposited to a rear surface, or on the contrary, surplus vapor of the vapor to be deposited to the rear surface would get over the band and would interfere with the vapor to be deposited to the front surface. Thereby, distribution of the deposited amount on the front surface of the band or distribution of the deposited amount on the rear surface would become non-uniform along the widthwise direction of the band. For example, if it is assumed that a deposited amount of the vapor deposition material on the front surface is $g_1$ g/m$^3$, a vapor pressure just before vapor deposition in this case is $P_1$ Torr, and also a deposited amount of the vapor deposition material on the rear surface is $g_2$ g/m$^3$ and a vapor pressure just before vapor deposition in this case is $P_2$ Torr, then when $g_1 < g_2$ is fulfilled, $P_1 < P_2$ is established. More particularly, the vapor of vapor deposition material having flown and come for the purpose of vapor-depositing onto the rear surface would get over the band and would go around to the front surface side, then it enters into the vapor deposition material having flown and come for the purpose of vapor-depositing onto the front surface, and disturbs the flow of vapor, resulting in non-uniformity of the deposited amount of the vapor deposition material onto the front surface along the widthwise direction of the band. In addition, as a part of the vapor deposition material on the rear surface side goes around to the front surface side, the flow of the vapor of the vapor deposition material itself on the rear surface side is also disturbed, and the deposited amount of the vapor deposition material onto the rear surface also would become non-uniform along the widthwise direction of the band.

In the vapor deposition apparatus according to the second feature of the present invention, in order to resolve the above-mentioned problem, a vapor-deposited surface area control device is provided, thereby the vapor-deposited surface area on the side of the band where the deposited amount is less is varied, and the ratio of the vapor-deposited surface area on the front surface side to the vapor-deposited surface area on the rear surface side is made to coincide with the ratio $g_1/g_2$ of the deposited amount $g_1$ of the vapor deposition material on the front surface to the deposited amount $g_2$ of the vapor deposition material on the rear surface. Thereby, even if $g_2 > g_1$ is fulfilled, $P_1 = P_2$ is established, hence the vapor pressures on the front surface side and on the rear surface side as bounded by the belt would be equalized, the flows of the vapor would not be disturbed, and so, the deposited amount $g_1$ g/m$^2$ of the vapor deposition material on the front surface as well as the deposited amount $g_2$ gm$^2$ of the vapor deposition material on the rear surface are made to be uniform along the widthwise direction of the band.

In addition, theoretically explaining this point, it is explained as follows.

A deposited amount g of vapor deposition material onto a band is represented by the following formula:

$$g \propto P_r \times \frac{L}{V} \tag{1}$$

where
L: a length (m) of a vapor deposition port,
V: a transit velocity (m/sec) of a band,
Pr: a vapor pressure (N/m$^2$) at a vapor deposition port,
g: a deposited amount (g/m$^2$) of vapor deposition material onto a band.

Here, if it is assumed that the deposited amount of vapor deposition material onto the front surface of the band is $g_1$ (g/m$^2$), the vapor pressure at this time is $P_1$ (N/m$^2$) and the aperture length of the vapor deposition port is $L_1$ (m), and on the other hand, if it is assumed that the deposited amount of vapor deposition material onto the rear surface of the band is $g_2 = 10 g_1 (g/m^2)$, the vapor pressure at this time is $P_2 (N/m^2)$ and aperture length of the vapor deposition port is $L_2$ (m), then the following relations are established:

$$P_1 \propto \frac{g_1 V}{L_1} \quad (2)$$

$$P_2 \propto \frac{g_2 V}{L_2} = \frac{10 g_1 V}{L_2} \quad (3)$$

And in the case where the aperture areas of the vapor deposition ports on both the front and rear sides of the band are identical, that is, $L_1 = L_2$, then the following relation is fulfilled.

$$P_2 = 10 P_1 \quad (4)$$

Accordingly, in this case as described previously, disturbance of a vapor flow would be generated on the both sides of the band.

On the other hand, in the above cited Equation (3), if $$L_1 = \frac{1}{10} L_2$$

is substituted, the following relation is fulfilled.

$$P_2 \propto \frac{10 g_1 V}{10 L_1} = \frac{g_1 V}{L_1} = P_1 \quad (5)$$

In other words, even if the deposited amounts on the respective sides of the band should be different, by controlling a ratio of vapor-deposited surface areas on the respective sides of the band, the vapor pressures on the respective sides of the band can be made identical. Thereby, disturbance would not be generated in the vapor flows in the vicinity of the vapor deposition ports on the respective sides as bounded by the band, hence distribution in the widthwise direction of the band, of the deposited amount of the vapor deposition material on the front and rear surfaces of the band would become uniform.

On the other hand, in the third-featured vacuum vapor deposition apparatus according to the present invention, the amounts of vapor led to the respective channels on the front and rear surface sides of the band to be vapor-deposited are respectively controlled independently by the vapor amount control device. Thereby, deposited amount on each of the front and rear surfaces of the band can be independently controlled.

For example, if it is assumed that a deposited amount of the vapor deposition material on the front surface is $g_1 g/m^3$, a vapor pressure just before vapor deposition in this case is $P_1$ Torr, and also a deposited amount of the vapor deposition material on the rear surface is $g^2$ g/m$^3$ and a vapor pressure just before vapor deposition in this case is $P_2$ Torr, then when $g_1 = g_2$ is fulfilled, $P_1$ becomes equal to $P_2$. Thereby interference between the vapor on the front and rear side of the band is prevented and widthwisely uniform deposition of the vapor can be obtained on each surface of the band.

On the other hand, in the case of $g_1 \neq g_2$, for example, $g_1 > g_2$, $P_1 > P_2$ is fulfilled. Accordingly, the vapor flows from the front surface side whoes pressure is higher to the rear surface side whoes pressure is lower. In this case, owing to the interference between the vapor on both sides, it is feared that the amount of deposition in a widthwise direction on each of the front and rear surfaces becomes ununiform. However, by the experiments conducted by the inventors revealed that, as shown in FIG. 7, by controlling the amount of deposition on each of the front and rear surfaces independently with the vapor amount control device, the widthwisely uniform deposition can be obtained even if $g_1 \neq g_2$.

The above-mentioned and other objects, features and advantages of the present invention will become more apparent by reference to the following description of one preferred embodiment of the invention taken in conjunction with the accompanying drawings.

DESCRIPTION OF THE PREFERRED EMBODIMENT

Figure 1:
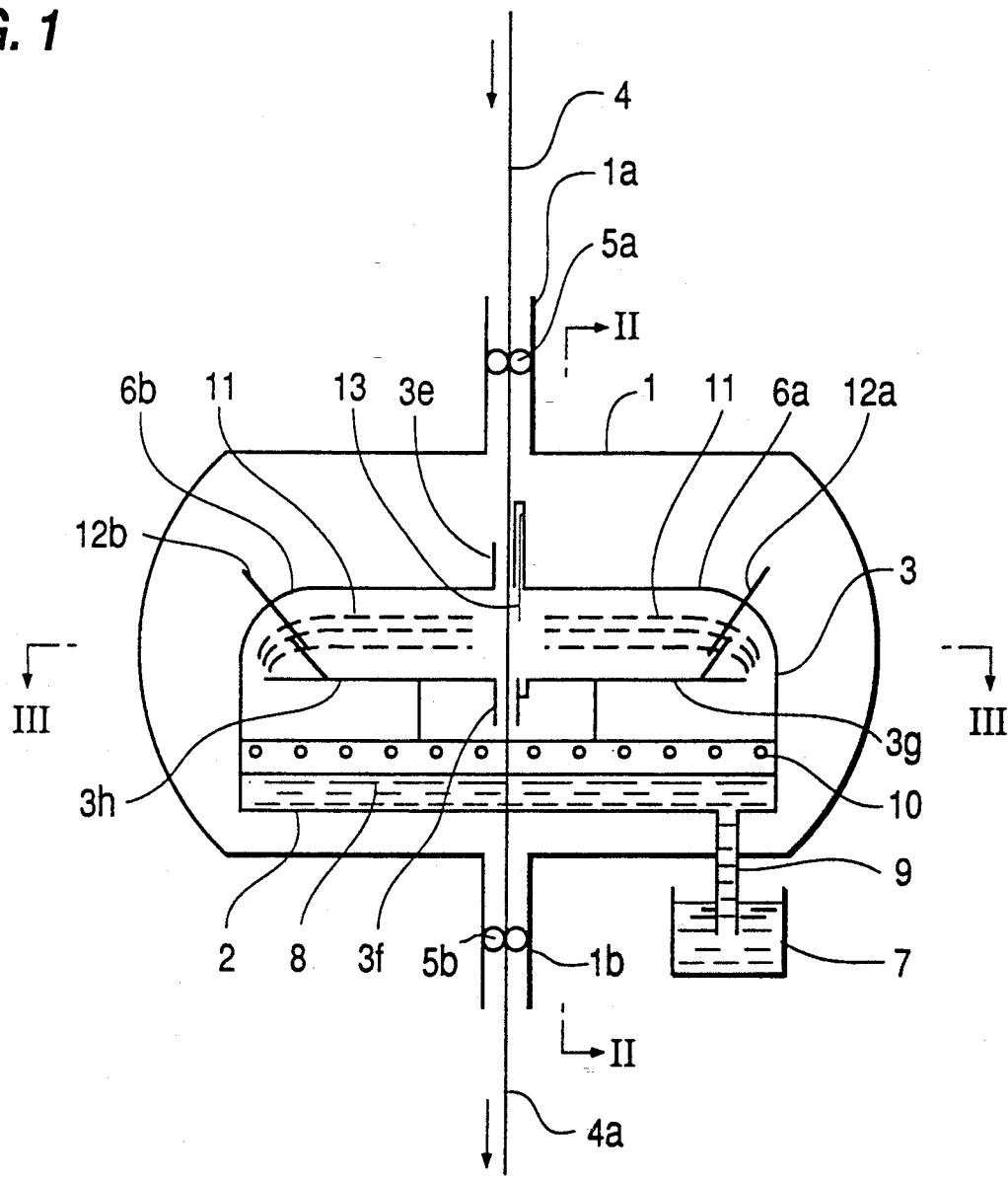
FIG. 1 is a front view of a vacuum vapor deposition apparatus according to the first preferred embodiment of the present invention.
Figure 2:
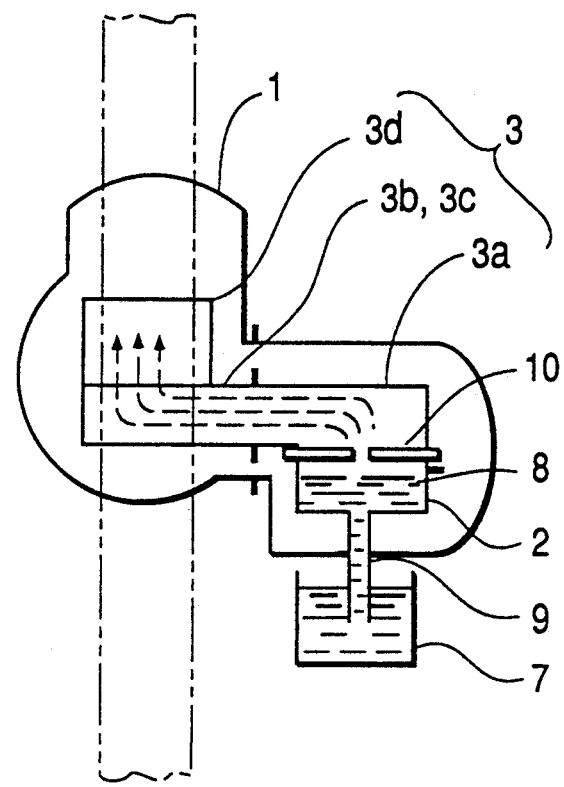
FIG. 2 is a vertical cross-section view of the same apparatus taken along line II—II in FIG. 1 as viewed in the direction of arrows.
Figure 3:
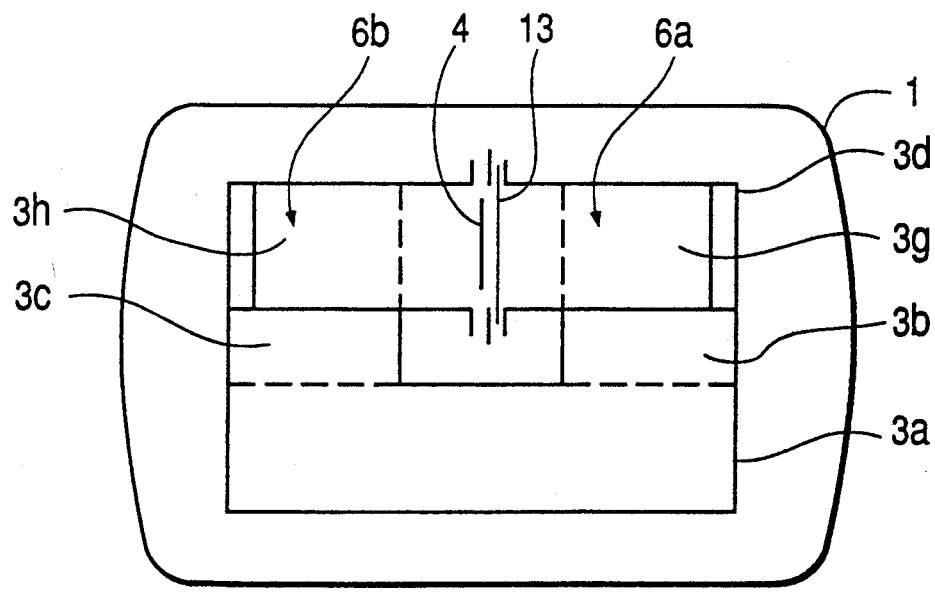
FIG. 3 is a horizontal cross-section view of the same apparatus taken along line III—III in FIG. 1 as viewed in the direction of arrows.
Figure 4:
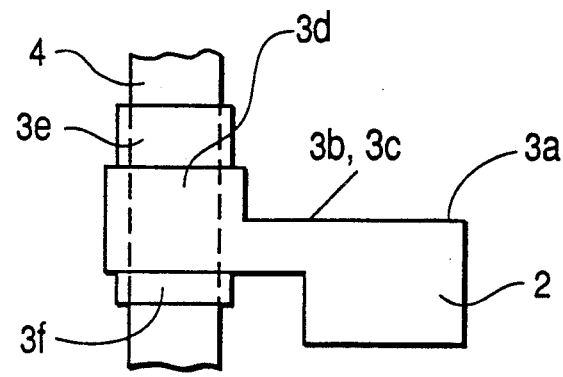
FIG. 4 is a side view of the same apparatus.

In the following, the present invention will be described in greater detail in connection to the first preferred embodiment of the invention illustrated in FIGS. 1 to 4. As shown in these figures, within a vacuum tank 1 are provided an evaporation tank 2 for evaporating vapor deposition material and a hood 3 covering the top of the evaporation tank 2 and extended up to the outside in the horizontal direction. The hood 3 consists of a hood main body 3a covering the evaporation tank 2, a passageway forming section 3b, 3c projected from this hood main body 3a in the horizontal direction for forming two passageways, and an extended section 3d communicated with the upper side of the tip end portions of these passageway forming section 3b, 3c to form one chamber for vapor deposition, and at the central portions of the upper and lower sides of this extended section 3d are formed an inlet port 3e and an outlet port 3f of a band steel 4 forming a band to be vapor-deposited. On the other hand, at the positions of the vacuum tank 1 corresponding respectively to the inlet port 3e and the outlet port 3f of the hood 3, also formed an inlet port 1a and an outlet port 1b for the band steel 4, and seal devices 5a and 5b are provided respectively at the inlet port 1a and the outlet port 1b. And, the band steel 4 is conveyed from up to down through the central portion of the extended section 3d of the hood 3 via the seal devices 5a and 5b. Accordingly, the extended section 3d of the hood 3 is divided into two sections by the band steel 4, in other words, on the front surface side (assumed to be the right side as viewed in FIG. 1) and on the rear surface side (assumed to be the left side as viewed in FIG. 1) of the band steel 4 are formed channels 6a and 6b for vapor-depositing onto the respective surfaces.

On the other hand, outside of the vacuum tank 1 is provided an atmospheric zinc melting furnace 7, and this zinc melting furnace 7 and the above-described evaporation tank 2 are connected through a snorkel 9 for sucking up molten zinc 8 into the evaporation tank 2 by making use of a pressure difference. In addition, at the upper portion of the evaporation tank 2 is disposed a heater 10 for heating the molten zinc 8 sucked up through the snorkel 9. The molten zinc 8 heated by the heater 10 evaporates as zinc vapor 11 into the hood main body 3a, and this zinc vapor 11 is divisionally led by the passageway forming section 3b, 3c communicating with the hood main body 3a to be respectively fed into the channels 6a and 6b on the respective sides of the band steel 4 within the extended section 3d. It is to be noted that at the boundaries between the passageway forming section 3b, 3c and the extended section 3d are provided baffle plates 3g and 3h, respectively, extending from the central side of the extended section 3d towards the outside, so that feed of the vapor into the channels 6a and 6b may be effected from the outside lower portion. In addition, on the inlet side of the vapor within the channels 6a and 6b are provided shutters 12a and 12b serving as vapor amount control devices for respectively controlling the amount of the zinc vapor 11 fed to the respective channels 6a and 6b. Furthermore, at the vapor deposition port in the channel 6a forming an aperture facing the band steel 4, is provided a vapor deposition surface area control device 13 in which a movable plate-shaped member can be moved in the direction along the surface of the plate by means of a driving device not shown.

It is to be noted that the hood 3, the shutters 12a and 12b and the vapor deposition surface area control device 13 are heated up to a temperature equal to or higher than the temperature of the molten zinc 8 by means of a heater not shown, and thereby it is prevented that the zinc vapor 11 condenses and adheres onto the inner wall surface of the respective members. In addition, the atmospheric zinc melting furnace 7 and the snorkel 9 are heated and held at about 450° C. by means of a heater not shown. Furthermore, the vacuum tank 1 is evacuated by means of a vacuum pump, the atmosphere therein is filled with nitrogen gas, and the pressure is controlled generally at 0.01-1 Torr in the case of vapor deposition of zinc.

Next, description will be made on the operation of the vacuum vapor deposition apparatus having the above-described construction.

When the molten zinc 8 sucked up from the atmospheric zinc melting furnace 7 through the snorkel 9 into the evaporation tank 2 by making use of a pressure difference is heated by the heater 10 and the zinc vapor 11 is led to the channels 6a and 6b and also the band steel 4 is introduced from the inlet port 1a of the vacuum tank 1 via the seal device 5a, the zinc vapor 11 having flown and come through the channel 6a is vapor-deposited onto the front surface of the band steel 4, the zinc vapor 11 having flown and come through the channel 6b is vapor-deposited onto the rear surface of the band steel 4, and thereby zinc plating is effected simultaneously onto the both surfaces of the band steel 4. And the zinc-plated band steel 4a is led out of the vacuum tank 1 via the seal device 5b provided at the outlet port 1b of the vacuum tank 1.

Here, the amounts of the zinc vapor 11 led to the channels 6a and 6b are respectively controlled by the shutters 12a and 12b, and for instance, $g_1$ g/m² is fed to the channel 6a as a deposited amount on the front surface of the band steel 4, while $g_2$ g/m² is fed to the channel 6b as a deposited amount on the rear surface of the band steel 4.

At this time, in the event that the deposited amounts on the front surface and the rear surface are the same, that is, in the case of $g_1 = g_2$, vapor deposition could be performed continuously under the same condition.

However, in the case of differential thickness plating in which the vapor-deposited amounts are different between the front surface and the rear surface, the vapor-deposited surface area of the channel 6a is appropriately regulated by the vapor-deposited surface area control device 13. More particularly, in the case of $g_1 < g_2$ (for instance, $$g_1 = \frac{1}{10} g_2),$$

in order to make the vapor pressure $P_1$ at the vapor deposition port on the front surface side of the band steel 4 and the vapor pressure $P_2$ at the vapor deposition port on the rear surface side the same pressure, regulation is effected by actuating the vapor-deposited surface area control device 13 in such manner that the vapor-deposited surface area on the front surface side may have a ratio of $g_1/g_2$ (for instance, $$\frac{1}{10})$$

with respect to the vapor-deposited surface area on the rear surface side. Thereby $P_1 = P_2$ is established, hence interference of vapor in the vicinity of the vapor deposition ports on the front surface side and rear surface side of the band steel 4, and distribution of deposition in the widthwise direction of the band steel 4 becomes uniform.

Also, in the case of effecting vapor deposition onto only one side surface of the band steel 4, in order to make $g_1 = 0$, the shutter 12a is perfectly closed and also the vapor-deposited surface area control device 13 is perfectly closed, and thereby vapor deposition is effected by means of only the channel 6b on the left side as viewed in FIG. 1.

It is to be noted that while the shutters 12a and 12b and the vapor-de surface area control device 13 are provided in order to perform differential thickness plating or one side surface plating in the vacuum vapor deposition apparatus of the above-described preferred embodiment, in the case of performing only uniform vapor deposition onto the both surfaces, these devices are unnecessary to be provided.

Also, while the vapor-deposited surface area control device 13 is provided only on one side of the band steel 4 in the above-described first preferred embodiment, it is a matter of course that it could be provided on the both sides.

In the above-described vacuum vapor deposition apparatus, within a single vacuum tank 1 are provided two vapor deposition apparatuses with there vapor deposition ports opposed to each other as bounded by the band steel 4, and so, vapor deposition can be effected simultaneously onto the front and rear surfaces of the band steel 4. In addition, in this case the evaporation tank 2 for generating vapor is provided one, the atmospheric zinc melting furnace 7 for feeding zinc serving as vapor deposition material to the evaporation tank 2 is provided also one, and so, as compared to the heretofore known apparatus, reduction of an installation expense is achieved.

Furthermore, in the above-described vapor deposition apparatus, since a channel portion for performing vapor deposition and an evaporation tank portion for performing evaporation are separated, maintenance works such as replacement of a lining of the evaporation tank 2 is easy, and also there is an advantage that an expense necessitated for maintenance can be also reduced.

It is to be noted that while description was made, by way of example, in connection to vapor deposition of zinc onto a band steel in the above-described embodiment, it is a matter of course that the present invention is applicable also to vapor deposition of other metals, ceramics and the like.

Figure 5:
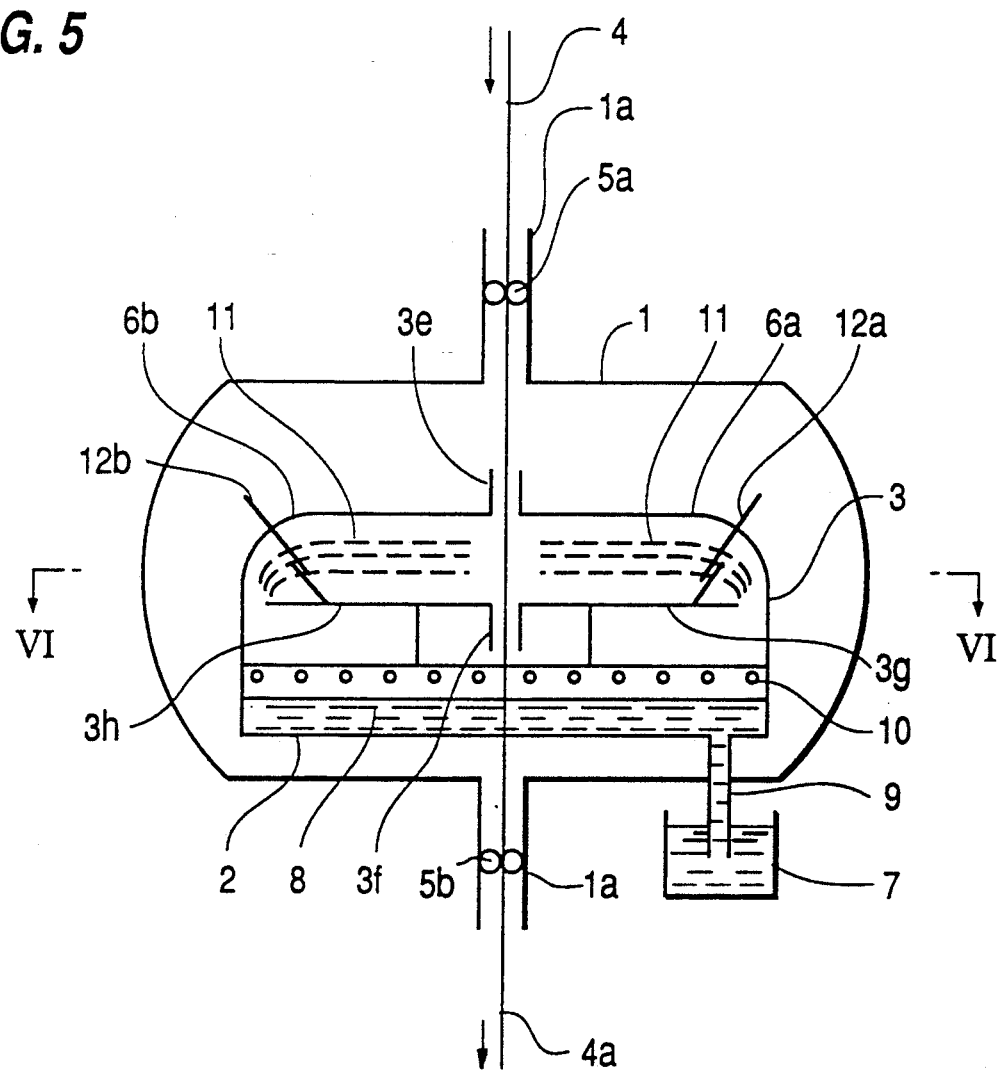
FIG. 5 is a front view of a vacuum vapor deposition apparatus according to the second preferred embodiment of the present invention.
Figure 6:
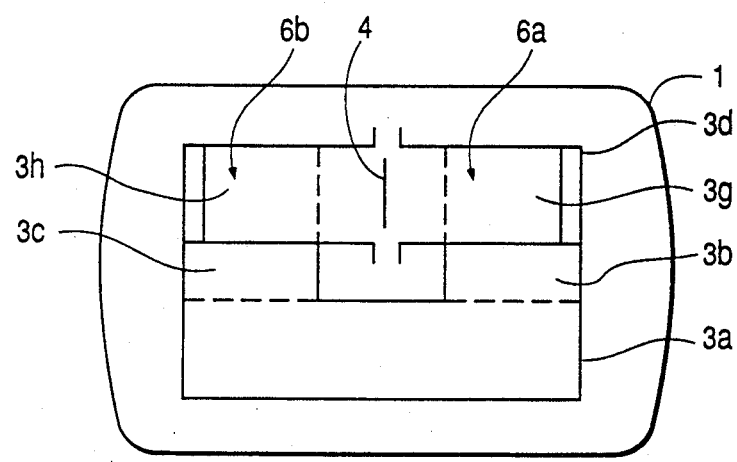
FIG. 6 is a horizontal cross-section view of the same apparatus taken along line VI—VI in FIG. 5 as viewed in the direction of arrows.
Figure 7:
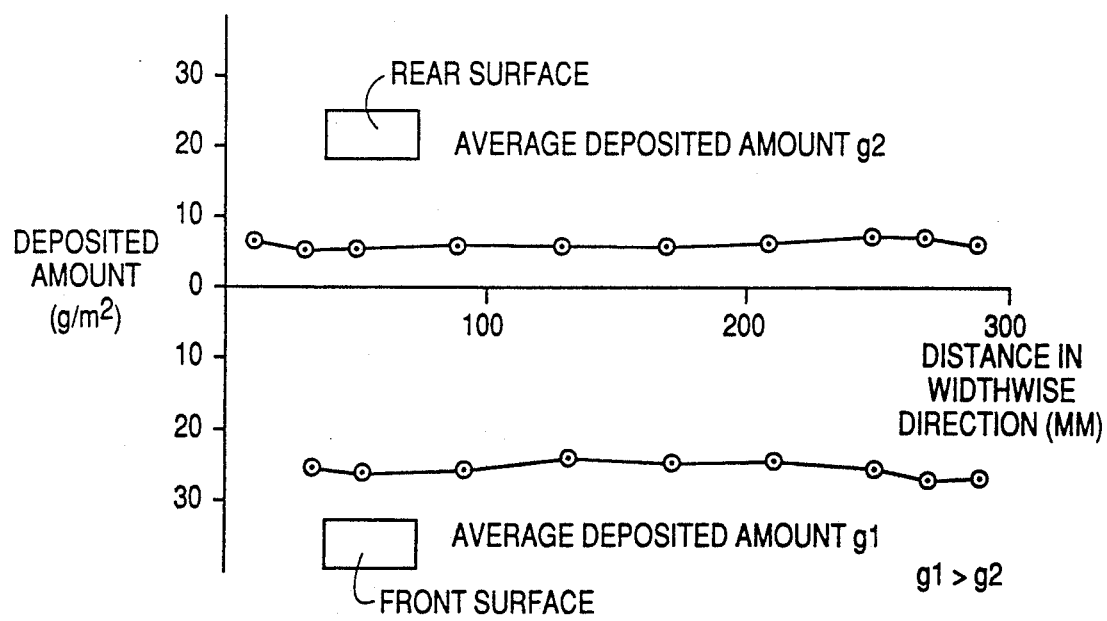
FIG. 7 is a graph showing an example of results obtained by experiments of vapor deposition.
Figure 8:
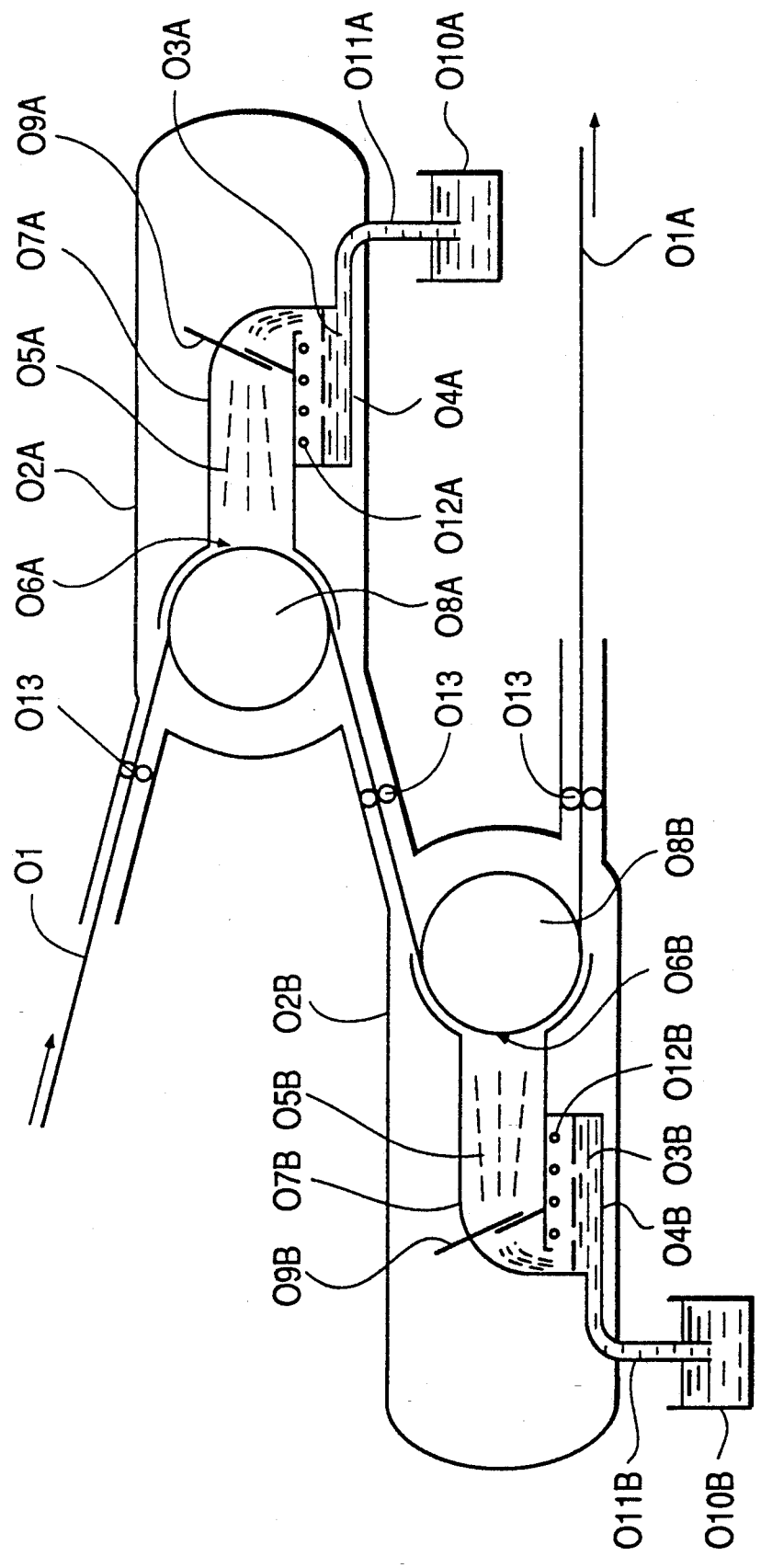
FIG. 8 is a schematic vertical cross-section view showing one example of a vacuum vapor deposition apparatus in the prior art.
Figure 9:
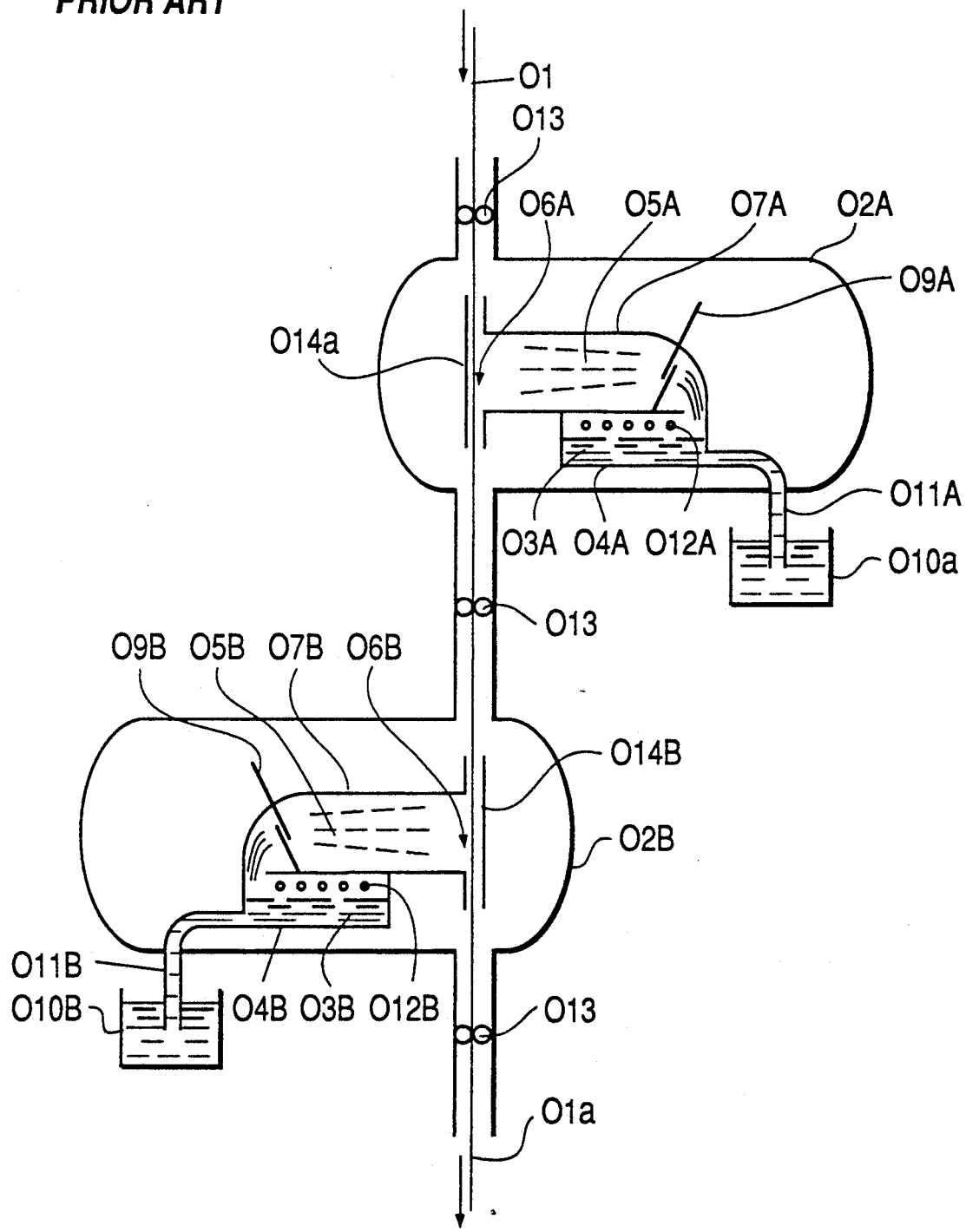
FIG. 9 is a schematic vertical cross-section view showing another example of a vacuum vapor deposition apparatus in the prior art.

In FIGS. 5 to 7, the second preferred embodiment of this invention is illustrated. In this embodiment, the vapor deposition surface area control device 13 is eliminated in the above first embodiment. The other construction of this embodiment is the same to that of the first embodiment.

Next, description will be made on the operation of the vacuum vapor deposition apparatus having the above-described construction.

When the molten zinc 8 sucked up from the atmospheric zinc melting furnace 7 through the snorkel 9 into the evaporation tank 2 by making use of a pressure difference is heated by the heater 10 and the zinc vapor 11 is led to the channels 6a and 6b and also the band steel 4 is introduced from the inlet port 1a of the vacuum tank 1 via the seal device 5a, the zinc vapor 11 having flown and come through the channel 6a is vapor-deposited onto the front surface of the band steel 4, the zinc vapor 11 having flown and come through the channel 6b is vapor-deposited onto the rear surface of the band steel 4, and thereby zinc plating is effected simultaneously onto the both surfaces of the band steel 4. And the zinc-plated band steel 4a is led out of the vacuum tank 1 via the seal device 5b provided at the outlet port 1b of the vacuum tank 1.

Here, the amounts of the zinc vapor 11 led to the channels 6a and 6b are respectively controlled by the shutters 12a and 12b, and for instance, $g_1 g/m^2$ is fed to the channel 6a as a deposited amount on the front surface of the band steel 4, while $g_2 g/m^2$ is fed to the channel 6b as a deposited amount on the rear surface of the band steel 4.

At this time, in the event that the deposited amounts on the front surface and the rear surface are the same, that is, in the case of $g_1 = g_2$, vapor deposition could be performed continuously under the same condition.

Also, in the case of effecting vapor deposition onto only one side surface of the band steel 4, in order to make $g_1 = 0$, the shutter 12a is perfectly closed and thereby vapor deposition is effected by means of only the channel 6b on the left side as viewed in FIG. 5.

It is to be noted that while the shutters 12a and 12b are provided in order to perform differential thickness plating or one side surface plating in the vacuum vapor deposition apparatus of the above-described preferred embodiment, in the case of performing only uniform vapor deposition onto the both surfaces, these devices are unnecessary to be provided.

Also, while the shutters 12a, 12b are provided on both sides of the band steel 4 in the above described second preferred embodiment, it is a matter of course that it could be provided on either side of the band steel.

In the above-described vacuum vapor deposition apparatus, within a single vacuum tank 1 are provided two vapor deposition apparatuses with there vapor deposition ports opposed to each other as bounded by the band steel 4, and so, vapor deposition can be effected simultaneously onto the front and rear surfaces of the band steel 4. In addition, in this case the evaporation tank 2 for generating vapor is provided one, the atmospheric zinc melting furnace 7 for feeding zinc serving as vapor deposition material to the evaporation tank 2 is provided also one, and so, as compared to the heretofore known apparatus, reduction of an installation expense is achieved.

Furthermore, in the above-described vapor deposition apparatus, since a channel portion for performing vapor deposition and an evaporation tank portion for performing evaporation are separated, maintenance works such as replacement of a lining of the evaporation tank 2 is easy, and also there is an advantage that an expense necessitated for maintenance can be also reduced.

It is to be noted that while description was made, by way of example, in connection to vapor deposition of zinc onto a band steel in the above-described embodiment, it is a matter of course that the present invention is applicable also to vapor deposition of other metals, ceramics and the like.

As will be apparent from the detailed description of the preferred embodiments above, in the vacuum vapor deposition apparatus according to the present invention, since the number of the vacuum tanks, the atmospheric melting furnaces, the evaporation tanks and the likes has been reduced from 2 sets to 1 set and also the wrapping rolls have been omitted, the installation becomes compact, and saving of space as well as reduction of cost can be achieved. In addition, although scratches and patterns on a plated surface caused by contact of a band with rolls were produced in the wrapping roll type apparatus in the prior art, according to the present invention these defects are completely eliminated, reduction of an expense necessitated for maintenance of the wrapping rolls which was conducted in the prior art can be achieved, and also improvements in quality of the products can be realized.

Furthermore, according to the present invention, by providing a vapor amount control device for controlling vapor as well as a vapor-deposited surface area control device, interference between the vapors on the front surface side and on the rear surface side can be prevented even upon differential thickness plating, and so, products having high quality in which irregularity in distribution of a vapor-deposited amount is not present, can be obtained.

While a principle of the present invention has been described above in connection to one preferred embodiment of the invention, it is intended that all matter contained in the above description and illustrated in the accompanying drawings shall be interpreted to be illustrative and not as a limitation to the scope of the present invention.

What is claimed is:

1. Vacuum vapor deposition apparatus comprising: an evaporation tank; a heater associated with said tank so as to evaporate vapor deposition material held by said tank; a hood covering said evaporation tank and extending in a horizontal direction between outer sides of said evaporation tank, said hood defining an interior vapor deposition chamber and inlet and outlet ports open to said chamber at positions located centrally of the outer sides of said evaporation tank in said horizontal direction; and a vacuum tank entirely surrounding said evaporation tank and said hood, said vacuum tank defining an interior space in which said evaporation tank and said hood are disposed, and said vacuum tank having sealing devices located at positions corresponding to the positions of said inlet and outlet ports of said hood, said sealing devices adapted to allow a band to travel therethrough and forming a seal between the interior space of said vacuum tank and the atmosphere outside the vacuum tank with a band traveling therethrough, whereby a steel band conveyed through said vacuum tank between said seal devices thereof travels through a central portion of said vacuum deposition chamber as passing from said inlet port to said outlet port of said hood.

2. A vacuum vapor deposition apparatus as claimed in claim 1, wherein said hood includes a main body covering said evaporation tank, a vapor passageway section extending horizontally from said main body and defining two discrete passageways through which vapors pass, and an extended section communicating with respective ends of said discrete passageways at the top of said vapor passageway section, said extended section defining the vapor deposition chamber therein, said inlet and said outlet ports being defined at upper and lower portions of said extended section, respectively.

3. A vacuum vapor deposition apparatus as claimed in claim 2, and further comprising baffle plates at boundaries between the vapor passageway section and the extended section of said hood, said baffle plates extending from a central portion of said extended section toward outer sides of said hood so as to define spaces thereunder from which vapors of deposition material are fed to the vapor deposition chamber.

4. Vacuum vapor deposition apparatus comprising: an evaporation tank; a heater associated with said tank so as to evaporate vapor deposition material held by said tank; a hood covering said evaporation tank and extending in a horizontal direction between outer sides of said evaporation tank, said hood defining an interior vapor deposition chamber and inlet and outlet ports open to said chamber at positions located centrally of the outer sides of said evaporation tank in said horizontal direction; a vacuum tank entirely surrounding said vacuum tank and said hood, said vacuum tank defining an interior space in which said evaporation tank and said hood are disposed, and said evaporation tank having sealing devices located at positions corresponding to the positions of said inlet and outlet ports of said hood, said sealing devices adapted to allow a band to travel therethrough and forming a seal between the interior space of said vacuum tank and the atmosphere outside the vacuum tank with a band traveling therethrough, whereby a steel band conveyed through said vacuum tank between said seal devices thereof travels through a central portion of said vacuum deposition chamber as passing from said inlet port to said outlet port of said hood; vapor control means for controlling the amount of vapor fed through said vapor deposition chamber; and a vapor surface area control device provided to at least one side of said inlet and outlet ports at a central area of said vapor deposition chamber, said vapor surface area control device being controllable to adjust a cross-sectional space in said vacuum deposition chamber which is open at said central area thereof, whereby various thickness of vacuum deposition material can be deposited, under the control of said vapor surface area control device, on at least one surface of a band traveling through the central portion of said vacuum chamber.

5. A vacuum vapor deposition apparatus as claimed in claim 4, wherein said hood includes a main body covering said evaporation tank, a vapor passageway section extending horizontally from said main body and defining two discrete passageways through which vapors pass, and an extended section communicating with respective ends of said discrete passageways at the top of said vapor passageway section, said extended section defining the vapor deposition chamber therein, said inlet and said outlet ports being defined at upper and lower portions of said extended section, respectively.

6. A vacuum vapor deposition apparatus as claimed in claim 5, and further comprising baffle plates at boundaries between the vapor passageway section and the extended section of said hood, said baffle plates extending from a central portion of said extended section toward outer sides of said hood so as to define spaces thereunder from which vapors of deposition material are fed to the vapor deposition chamber.

7. Vacuum vapor deposition apparatus comprising: an evaporation tank; a heater associated with said tank so as to evaporate vapor deposition material held by said tank; a hood covering said evaporation tank and extending in a horizontal direction between outer sides of said evaporation tank, said hood defining an interior vapor deposition chamber and inlet and outlet ports open to said chamber at positions located centrally of the outer sides of said evaporation tank in said horizontal direction; a vacuum tank entirely surrounding said evaporation tank and said hood, said vacuum tank defining an interior space in which said evaporation tank and said hood are disposed, and said vacuum tank having sealing devices located at positions corresponding to the positions of said inlet and outlet ports of said hood, said sealing devices adapted to allow a band to travel therethrough and forming a seal between the interior space of said vacuum tank and the atmosphere outside the vacuum tank with a band traveling therethrough, whereby a steel band conveyed through said vacuum tank between said seal devices thereof travels through a central portion of said vacuum deposition chamber as passing from said inlet port to said outlet port of said hood; and vapor control means for controlling the amount of vapor fed through said vapor deposition chamber.

8. A vacuum vapor deposition apparatus as claimed in claim 7, wherein said hood includes a main body covering said evaporation tank, a vapor passageway section extending horizontally from said main body and defining two discrete passageways through which vapors pass, and an extended section communicating with respective ends of said discrete passageways at the top of said vapor passageway section, said extended section defining the vapor deposition chamber therein, said inlet and said outlet ports being defined at upper and lower portions of said extended section, respectively.

9. A vacuum vapor deposition apparatus as claimed in claim 8, and further comprising baffle plates at boundaries between the vapor passageway section and the extended section of said hood, said baffle plates extending from a central portion of said extended section toward outer sides of said hood so as to define spaces thereunder from which vapors of deposition material are fed to the vapor deposition chamber.

* * * * *